US012668878B2

(12) United States Patent
Takano et al.

(10) Patent No.: US 12,668,878 B2
(45) Date of Patent: Jun. 30, 2026

(54) SUBSTRATE PROCESSING APPARATUS

(71) Applicant: Kokusai Electric Corp., Toyama (JP)

(72) Inventors: Satoshi Takano, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 841 days.

(21) Appl. No.: 17/587,650

(22) Filed: Jan. 28, 2022

(65) Prior Publication Data

US 2022/0154341 A1 May 19, 2022

Related U.S. Application Data

(62) Division of application No. 17/021,618, filed on Sep. 15, 2020, now abandoned.

(30) Foreign Application Priority Data

Mar. 23, 2020 (JP) ................................. 2020-051056

(51) Int. Cl.
*C23C 16/455* (2006.01)
*C23C 16/04* (2006.01)
(Continued)

(52) U.S. Cl.
CPC ...... *C23C 16/45551* (2013.01); *C23C 16/045* (2013.01); *C23C 16/45517* (2013.01);
(Continued)

(58) Field of Classification Search
CPC ........ C23C 16/45517; C23C 16/45525; C23C 16/45527; C23C 16/45529;
(Continued)

(56) References Cited

U.S. PATENT DOCUMENTS 9,460,893 B2 * 10/2016 Kawamata ........ H01J 37/32091
2002/0192899 A1 12/2002 Shimamoto et al.
(Continued)

FOREIGN PATENT DOCUMENTS

CN 110718461 A 1/2020
JP 2012-079919 A 4/2012
(Continued)

OTHER PUBLICATIONS

Korean Office Action issued on Apr. 21, 2022 for Korean Patent Application No. 10-2020-0118087.
(Continued)

*Primary Examiner* — Kurt Sweely
(74) *Attorney, Agent, or Firm* — Volpe Koenig

(57) ABSTRACT

Described herein is a technique capable of forming a film so as to fill a recess of a substrate. According to one aspect thereof, there is provided a substrate processing apparatus including: a substrate mounting table on which a substrate is placed; an adsorption inhibiting gas supplier configured to supply an adsorption inhibiting gas onto a surface of the substrate from above the substrate mounting table; and a source gas supplier configured to supply a source gas onto the surface of the substrate from above the substrate mounting table, wherein a distance D1 between a gas supply port provided in the adsorption inhibiting gas supplier and the substrate is greater than a distance D2 between a gas supply port provided in the source gas supplier and the substrate.

18 Claims, 5 Drawing Sheets

(51) Int. Cl.
    *C23C 16/52*          (2006.01)
    *C23C 16/54*          (2006.01)

(52) U.S. Cl.
    CPC .. *C23C 16/45534* (2013.01); *C23C 16/45574*
           (2013.01); *C23C 16/52* (2013.01); *C23C*
           *16/45548* (2013.01); *C23C 16/54* (2013.01)

(58) Field of Classification Search
    CPC ........ C23C 16/45544; C23C 16/45548; C23C
           16/45551; C23C 16/45561; C23C
           16/45563; C23C 16/45568; C23C
           16/45578; C23C 16/45587; C23C
        16/45589; C23C 16/4584; C23C 16/481;
           C23C 16/52; C23C 16/045; C23C
        16/45534; C23C 16/45574; C23C 16/54;
           H01L 21/46; H01L 21/461
    See application file for complete search history.

(56) References Cited

U.S. PATENT DOCUMENTS

| | | |
|---|---|---|
| 2004/0082171 A1 | 4/2004 | Shin et al. |
| 2005/0268856 A1* | 12/2005 | Miller ............... C23C 16/45519 |
| | | 118/729 |
| 2007/0215036 A1 | 9/2007 | Park et al. |
| 2009/0285986 A1 | 11/2009 | Park et al. |
| 2010/0041213 A1 | 2/2010 | Lee |
| 2010/0310771 A1 | 12/2010 | Lee |
| 2011/0033638 A1* | 2/2011 | Ponnekanti ............. C23C 16/52 |
| | | 118/723 E |
| 2011/0076421 A1 | 3/2011 | Lee |
| 2011/0120542 A1 | 5/2011 | Levy |
| 2011/0120543 A1 | 5/2011 | Levy |
| 2011/0120544 A1 | 5/2011 | Levy |
| 2011/0120757 A1 | 5/2011 | Levy |
| 2011/0124204 A1 | 5/2011 | Ota et al. |
| 2011/0268891 A1 | 11/2011 | Macneil et al. |
| 2011/0318940 A1 | 12/2011 | Ota et al. |
| 2012/0003396 A1 | 1/2012 | Maas et al. |
| 2012/0141676 A1 | 6/2012 | Sershen et al. |
| 2012/0196050 A1 | 8/2012 | Vermeer et al. |
| 2012/0222620 A1 | 9/2012 | Yudovsky |
| 2012/0225191 A1 | 9/2012 | Yudovsky et al. |
| 2012/0225192 A1 | 9/2012 | Yudovsky et al. |
| 2013/0001330 A1 | 1/2013 | Huang |
| 2013/0012029 A1* | 1/2013 | Vermeer ........... H01J 37/32568 |
| | | 427/535 |
| 2013/0095668 A1 | 4/2013 | Saito et al. |
| 2013/0118895 A1 | 5/2013 | Roozeboom et al. |
| 2013/0140064 A1 | 6/2013 | Burberry et al. |
| 2013/0260034 A1 | 10/2013 | Pak et al. |
| 2013/0337660 A1 | 12/2013 | Ota et al. |
| 2014/0030445 A1 | 1/2014 | Vermeer et al. |
| 2014/0044887 A1 | 2/2014 | Vermeer et al. |
| 2014/0087567 A1 | 3/2014 | Toyoda et al. |
| 2014/0137976 A1 | 5/2014 | Miller et al. |
| 2014/0147587 A1 | 5/2014 | Endo et al. |
| 2014/0179120 A1 | 6/2014 | Ogawa |
| 2014/0242790 A1 | 8/2014 | Harada et al. |
| 2014/0363983 A1 | 12/2014 | Nakano et al. |
| 2015/0125627 A1 | 5/2015 | Lee et al. |
| 2015/0140786 A1 | 5/2015 | Kwak |
| 2015/0214044 A1 | 7/2015 | Yanai et al. |
| 2015/0225848 A1 | 8/2015 | Han et al. |
| 2015/0243545 A1 | 8/2015 | Tang et al. |
| 2015/0294860 A1 | 10/2015 | Ohashi |
| 2015/0307988 A1* | 10/2015 | Saido .................. C23C 16/4412 |
| | | 438/758 |
| 2015/0361550 A1 | 12/2015 | Yabe et al. |
| 2015/0376782 A1 | 12/2015 | Griffin et al. |
| 2016/0068952 A1 | 3/2016 | Sasaki |
| 2016/0079070 A1 | 3/2016 | Ogawa et al. |
| 2016/0153085 A1 | 6/2016 | Ueda |

| | | |
|---|---|---|
| 2016/0153086 A1 | 6/2016 | Kwak et al. |
| 2017/0067156 A1 | 3/2017 | Leeser |
| 2017/0175266 A1 | 6/2017 | Kumagai |
| 2017/0218517 A1 | 8/2017 | Fukiage et al. |
| 2017/0243742 A1 | 8/2017 | Takahashi et al. |
| 2017/0247794 A1 | 8/2017 | Mukae et al. |
| 2017/0314123 A1 | 11/2017 | Shimizu |
| 2017/0335453 A1 | 11/2017 | Miura |
| 2017/0338099 A1 | 11/2017 | Miura |
| 2018/0002808 A1 | 1/2018 | Chung et al. |
| 2018/0005836 A1 | 1/2018 | Lim et al. |
| 2018/0044790 A1 | 2/2018 | Van Cleemput |
| 2018/0135177 A1 | 5/2018 | Lee et al. |
| 2018/0204716 A1 | 7/2018 | Takahashi et al. |
| 2018/0254179 A1 | 9/2018 | Chan et al. |
| 2019/0051511 A1 | 2/2019 | Kato et al. |
| 2019/0051512 A1 | 2/2019 | Kato et al. |
| 2019/0051513 A1 | 2/2019 | Kato et al. |
| 2019/0074167 A1 | 3/2019 | Ono et al. |
| 2019/0172700 A1 | 6/2019 | Kubo et al. |
| 2019/0283077 A1 | 9/2019 | Pore et al. |
| 2019/0287843 A1 | 9/2019 | Yahata et al. |
| 2019/0304776 A1 | 10/2019 | Choi |
| 2019/0390340 A1 | 12/2019 | Yu et al. |
| 2020/0013616 A1* | 1/2020 | Abel ................. H01L 21/02274 |
| 2020/0017968 A1 | 1/2020 | Kato et al. |
| 2020/0032390 A1 | 1/2020 | Kato |
| 2020/0098563 A1 | 3/2020 | Shoji |
| 2020/0243330 A1 | 7/2020 | Kubo et al. |
| 2020/0251326 A1 | 8/2020 | Kubo et al. |

FOREIGN PATENT DOCUMENTS

| | | |
|---|---|---|
| JP | 2016-056410 A | 4/2016 |
| JP | 2016-102242 A | 6/2016 |
| JP | 2016-162847 A | 9/2016 |
| JP | 2017-139451 A | 8/2017 |
| JP | 2019-161071 A | 9/2019 |
| JP | 2020-012136 A | 1/2020 |
| JP | 2020-017708 A | 1/2020 |
| JP | 2020-123673 A | 8/2020 |
| JP | 2020-126898 A | 8/2020 |
| KP | 10-2015-0123130 A | 11/2015 |
| TW | 201541535 A | 11/2015 |

OTHER PUBLICATIONS

Taiwan Office Action issued on Dec. 7, 2021 for Taiwan Patent Application No. 109131507.

Yu et al., "Atomic Layer Deposition of High Purity Metal Films," Jun. 2018, pp. 1-53.

Yu et al., "Atomic Layer Deposition of High Purity Metal Films," Feb. 2019, pp. 1-55.

Yu et al., "Methods of Deposition Control," Apr. 2019, pp. 1-45.

Yu et al., "Catalyst Enhanced Chemical Vapor Deposition of Ruthenium," Apr. 2019, pp. 1-34.

Japanese Office Action dated Aug. 24, 2021 for Japanese Patent Application No. 2020-051056.

U.S. Appl. No. 62/849,011, filed May 16, 2019 in the names of Sang Lan Ho Yu et al., and entitled "Low Temperature Deposition of Low Impurity Molybdenum Films." pp. 1-54. (Year: 2019).

U.S. Appl. No. 62/688,758, filed Jun. 22, 2018 in the names of Sang Ho Yu et al., and entitled "Atomic Layer Deposition of High Purity Metal Films." pp. 1-53. (Year: 2018).

U.S. Appl. No. 62/808,268, filed Feb. 20, 2019 in the names of Sang Ho Yu et al., and entitled "Atomic Layer Deposition of High Purity Metal Films." pp. 1-55. (Year: 2019).

U.S. Appl. No. 62/830,909, filed Apr. 8, 2019 in the names of Sang Lan Ho Yu et al., and entitled "Methods of Deposition Control." pp. 1-45. (Year: 2019).

U.S. Appl. No. 62/830,911, filed Apr. 8, 2019 in the names of Sang Lan Ho Yu et al., and entitled "Catalyst Enhanced Chemical Vapor Deposition of Ruthenium." pp. 1-34. (Year: 2019).

* cited by examiner

ADSORPTION INHIBITING LAYER

SILICON-CONTAINING LAYER

SiN LAYER

200

SUBSTRATE PROCESSING APPARATUS

CROSS-REFERENCE TO RELATED PATENT APPLICATIONS

This application is a divisional of U.S. patent application Ser. No. 17/021,618, filed Sep. 15, 2020, which claims the benefit of Japanese Patent Application No. 2020-051056, filed on Mar. 23, 2020, the entire contents of which are incorporated by reference as if fully set forth.

BACKGROUND

1. Field

The present disclosure relates to a substrate processing apparatus.

2. Description of the Related Art

As a part of manufacturing processes of a semiconductor device, a process of forming a film on a substrate may be performed. The process of forming the film may be performed so as to fill a recess (which is a concave portion) provided on a surface of the substrate.

SUMMARY

Described herein is a technique capable of forming a film so as to fill a recess of a substrate.

According to one aspect of the technique of the present disclosure, there is provided a processing apparatus including: a substrate mounting table on which a substrate is placed; an adsorption inhibiting gas supplier configured to supply an adsorption inhibiting gas onto a surface of the substrate from above the substrate mounting table; and a source gas supplier configured to supply a source gas onto the surface of the substrate from above the substrate mounting table, wherein a distance D1 between a gas supply port provided in the adsorption inhibiting gas supplier and the substrate is greater than a distance D2 between a gas supply port provided in the source gas supplier and the substrate.

DETAILED DESCRIPTION

Hereinafter, one or more embodiments (also simply referred to as "embodiments") according to the technique of the present disclosure will be described.

First Embodiment of Technique

Hereinafter, a first embodiment according to the technique of the present disclosure will be described with reference to the drawings.

(1) Configuration of Substrate Processing Apparatus

First, a configuration of a substrate processing apparatus 100 will be described with reference to FIGS. 1, 2A, 2B and 3. The substrate processing apparatus 100 according to the present embodiment is configured as a single wafer type substrate processing apparatus capable of processing a substrate to be processed one by one. For example, as the substrate to be processed by the substrate processing apparatus 100, a semiconductor wafer substrate (hereinafter simply referred to as "wafer") on which a semiconductor device is formed may be used.

\<Process Vessel\>

The substrate processing apparatus 100 according to the present embodiment includes a process vessel (not shown). For example, the process vessel is made of a metal material such as aluminum (Al) and stainless steel (SUS), and is a sealed vessel. A substrate loading/unloading port (not shown) is provided on a side surface of the process vessel, and a wafer 200 may be transferred into or out of the process vessel via the substrate loading/unloading port. In addition, a gas exhaust system such as a vacuum pump and a pressure controller (not shown) is connected to the process vessel. It is possible to adjust an inner pressure of the process vessel to a predetermined pressure by using the gas exhaust system.

\<Substrate Mounting Table\>

Figure 1:
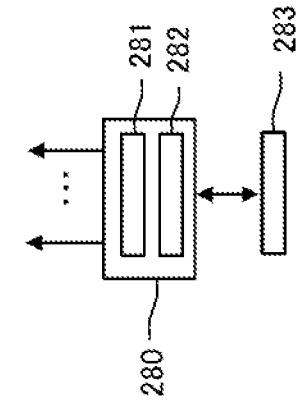
FIG. 1 schematically illustrates an example of a main configuration of a substrate processing apparatus according to a first embodiment described herein.
Figure 1:
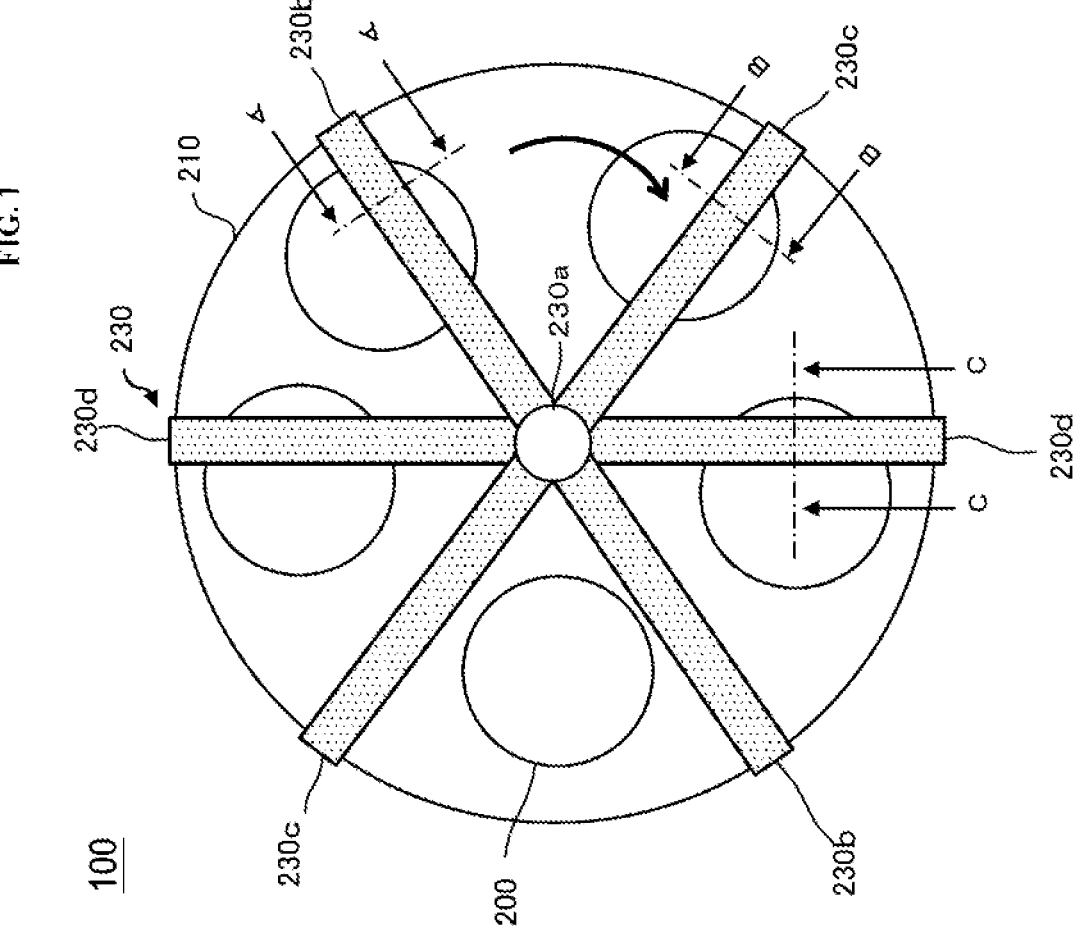

A substrate mounting table 210 on which the wafer 200 is placed is provided in the process vessel. For example, the substrate mounting table 210 is of a disk shape when viewed from above, and is configured such that a plurality of wafers including the wafer 200 are placed on an upper surface thereof (a substrate placing surface) in a circumferential direction at equal intervals. In addition, the substrate mounting table 210 includes a heater (not shown) serving as a heating source embedded therein, and is configured such that a temperature of the wafer 200 is maintained to a predetermined temperature using the heater. The substrate mounting table 210 is configured to be rotationally driven by a rotator (which is a rotating mechanism, not shown) around a center position of the substrate mounting table 210 when viewed from above as a rotation axis. The rotator configured to rotationally drive the substrate mounting table 210 may include at least a rotational bearing configured to support the substrate mounting table 210 to be rotatable and a drive source represented by an electric motor. In FIG. 1, the plurality of the wafers (for example, 5 wafers) including the wafer 200 are placed on the substrate mounting table 210. However, the present embodiment is not limited thereto, and the number of the plurality of the wafers placed wafers on the substrate mounting table 210 may be appropriately set. For example, as the number of the plurality of the wafers placed wafers on the substrate mounting table 210 is increased, it is possible to improve the process throughput, and as the number of the plurality of the wafers placed wafers on the substrate mounting table 210 is decreased, it is possible to prevent the substrate mounting table 210 from becoming large. Since the substrate placing surface of the substrate mounting table 210 is directly in contact with the wafer 200, preferably, for example, the substrate placing surface is made of a material such as quartz and alumina.

<Cartridge Head>

A cartridge head 230 serving as a gas supplier (which is a gas supply mechanism) for the wafer 200 on the substrate mounting table 210 is provided above the substrate mounting table 210. The cartridge head 230 includes a central support 230a arranged in the vicinity of the center position of the substrate mounting table 210 and a plurality of cartridges 230b, 230c and 230d which extend radially from the central support 230a toward an outer peripheral side of the substrate mounting table 210. Specifically, for example, the cartridge head 230 includes a total of six cartridges arranged sequentially in an order of the cartridge 230b, the cartridge 230c, the cartridge 230d, the cartridge 230b, the cartridge 230c and the cartridge 230d along a circumference centered on the central support part 230a at substantially equal intervals. Each of the cartridges 230b, 230c and 230d extends beyond an outer peripheral edge of the wafer 200 on the substrate mounting table 210 and further to the outer peripheral side of the substrate mounting table 210.

In FIG. 1, two cartridges 230b, two cartridges 230c and two cartridges 230d are provided in the cartridge head 230 in the circumferential direction at equal intervals centered on the central support 230a, that is, a total of six cartridges 230b, 230c and 230d are provided in the cartridge head 230. However, the present embodiment is not limited thereto, and the number of the cartridges 230b, 230c and 230d may be appropriately set in consideration of conditions such as the number of gas species supplied to the wafer 200 and the process throughput.

According to the present embodiment, for example, each of the cartridges 230b, 230c and 230d is configured to extend in a belt shape from the central support 230a toward the outer peripheral side of the substrate mounting table 210. That is, each of the cartridges 230b, 230c and 230d is of a substantially rectangular planar shape whose longitudinal direction is arranged toward the outer peripheral side of the substrate mounting table 210. However, the planar shape of each of the cartridges 230b, 230c and 230d is not limited thereto. For example, in consideration of a relationship between a gas supply amount and a peripheral speed difference between inner and outer peripheries when the substrate mounting table 210 and the cartridge head 230 are relatively moved, which will be described later. Each of the cartridges 230b, 230c and 230d may be of a fan shape extending toward the outer peripheral side the substrate mounting table 210. Regardless of the planar shape thereof, a size in the longitudinal direction of each of the cartridges 230b, 230c and 230d is greater than a maximum diameter of the wafer 200.

<Cartridge>

A configuration of each of the cartridges 230b, 230c and 230d included in the cartridge head 230 will be described in detail with reference to FIGS. 2A, 2B and 3.

Figures 2A, 2B:
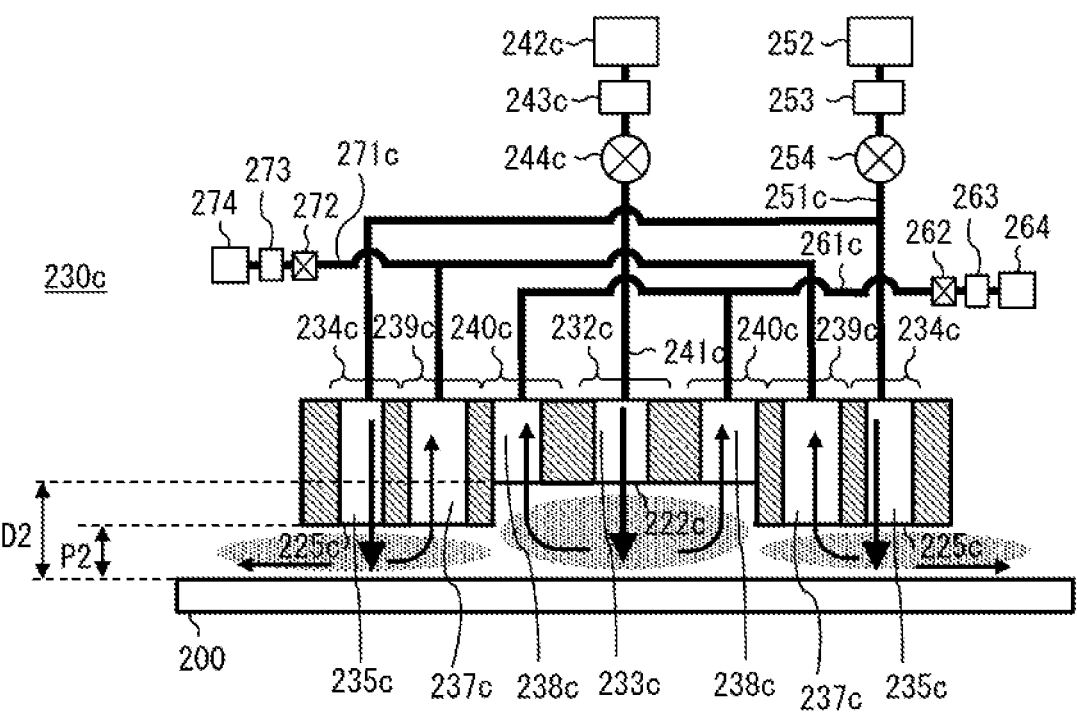
FIGS. 2A and 2B illustrate the example of the main configuration of the substrate processing apparatus according to the first embodiment described herein in detail, FIG. 2A schematically illustrates a vertical cross-section of the substrate processing apparatus taken along the line A-A of the substrate processing apparatus shown in FIG. 1, and FIG. 2B schematically illustrates a vertical cross-section of the substrate processing apparatus taken along the line B-B of the substrate processing apparatus shown in FIG. 1.

FIG. 2A schematically illustrates a vertical cross-section of the substrate processing apparatus 100 taken along the line A-A shown in FIG. 1. In particular, FIG. 2A illustrates an exemplary configuration of the cartridge 230b in detail.

The cartridge 230b includes an adsorption inhibiting gas supplier 232b (hereinafter, also simply referred to as a "gas supplier 232b"). The gas supplier 232b is configured to supply an adsorption inhibiting gas onto the surface of the wafer 200 from above the substrate mounting table 210. The gas supplier 232b is provided with an adsorption inhibiting gas supply hole 233b (hereinafter, also simply referred to as a "gas supply hole 233b") which is a through-hole for the adsorption inhibiting gas. In addition, an adsorption inhibiting gas supply port 222b (hereinafter, also simply referred to as a "gas supply port 222b") is provided at a lower end of the gas supply hole 233b. In the present specification, a distance between the gas supply port 222b provided in the gas supplier 232b and the surface of the wafer 200 is referred to as a distance D1.

The cartridge 230b further includes a pair of adsorption inhibiting gas exhausters 240b (hereinafter, also simply referred to as "gas exhausters 240b") provided on both sides of the gas supplier 232b. Each of the gas exhausters 240b provided on both sides of the gas supplier 232b is configured to exhaust the adsorption inhibiting gas. Each of the gas exhausters 240b is provided with an adsorption inhibiting gas exhaust hole 238b (hereinafter, also simply referred to as a "gas exhaust hole 238b") which is a through-hole for the adsorption inhibiting gas.

The cartridge 230b further includes a pair of first inert gas suppliers 234b (hereinafter, also simply referred to as "gas suppliers 234b") provided on both sides of the pair of gas exhausters 240b. Each of the gas suppliers 234b provided on both sides of the gas supplier 232b is configured to supply an inert gas onto the surface of the wafer 200 from above the substrate mounting table 210. Each of the gas suppliers 234b is provided with a first inert gas supply hole 235b (hereinafter, also simply referred to as a "gas supply hole 235b") which is a through-hole for the inert gas. In addition, a first inert gas supply port 225b (hereinafter, also simply referred to as a "gas supply port 225b") is provided at a lower end of the gas supply hole 235b. In this specification, a distance between the gas supply port 225b provided in the gas suppliers 234b and the surface of the wafer 200 is referred to as a distance P1.

The cartridge 230b further includes a pair of first inert gas exhausters 239b (hereinafter, also simply referred to as "gas exhausters 239b") between the gas exhausters 240b and the gas suppliers 234b. Each of the gas exhausters 239b is configured to exhaust the inert gas. Each of the gas exhausters 239b is provided with a first inert gas exhaust hole 237b (hereinafter, also simply referred to as a "gas exhaust hole 237b") which is a through-hole for the inert gas.

FIG. 2B schematically illustrates a vertical cross-section of the substrate processing apparatus 100 taken along the line B-B shown in FIG. 1. In particular, FIG. 2B illustrates an exemplary configuration of the cartridge 230c in detail.

The cartridge 230c includes a source gas supplier 232c (hereinafter, also simply referred to as a "gas supplier 232c"). The gas supplier 232c is configured to supply a source gas onto the surface of the wafer 200 from above the substrate mounting table 210. The gas supplier 232c is provided with a source gas supply hole 233c (hereinafter, also simply referred to as a "gas supply hole 233c") which is a through-hole for the source gas. In addition, a source gas supply port 222c (hereinafter, also simply referred to as a "gas supply port 222c") is provided at a lower end of the gas supply hole 233c. In the present specification, a distance between the gas supply port 222c provided in the gas supplier 232c and the surface of the wafer 200 is referred to as a distance D2.

The cartridge 230c further includes a pair of source gas exhausters 240c (hereinafter, also simply referred to as "gas exhausters 240c") provided on both sides of the gas supplier 232c. Each of the gas exhausters 240c provided on both sides of the gas supplier 232c is configured to exhaust the source gas. Each of the gas exhausters 240c is provided with a source gas exhaust hole 238c (hereinafter, also simply referred to as a "gas exhaust hole 238c") which is a through-hole for the source gas.

The cartridge 230c further includes a pair of second inert gas suppliers 234c (hereinafter, also simply referred to as "gas suppliers 234c") provided on both sides of the pair of gas exhausters 240c. Each of the gas suppliers 234c provided on both sides of the gas supplier 232c is configured to supply the inert gas onto the surface of the wafer 200 from above the substrate mounting table 210. Each of the gas suppliers 234c is provided with a second inert gas supply hole 235c (hereinafter, also simply referred to as a "gas supply hole 235c") which is a through-hole for the inert gas. In addition, a second inert gas supply port 225c (hereinafter, also simply referred to as a "gas supply port 225c") is provided at a lower end of the gas supply hole 235c. In this specification, a distance between the gas supply port 225c provided in the gas suppliers 234c and the surface of the wafer 200 is referred to as a distance P2.

The cartridge 230c further includes a pair of second inert gas exhausters 239c (hereinafter, also simply referred to as "gas exhausters 239c") between the gas exhausters 240c and the gas suppliers 234c. Each of the gas exhausters 239c is configured to exhaust the inert gas. Each of the gas exhausters 239c is provided with a second inert gas exhaust hole 237c (hereinafter, also simply referred to as a "gas exhaust hole 237c") which is a through-hole for the inert gas.

Figure 3:
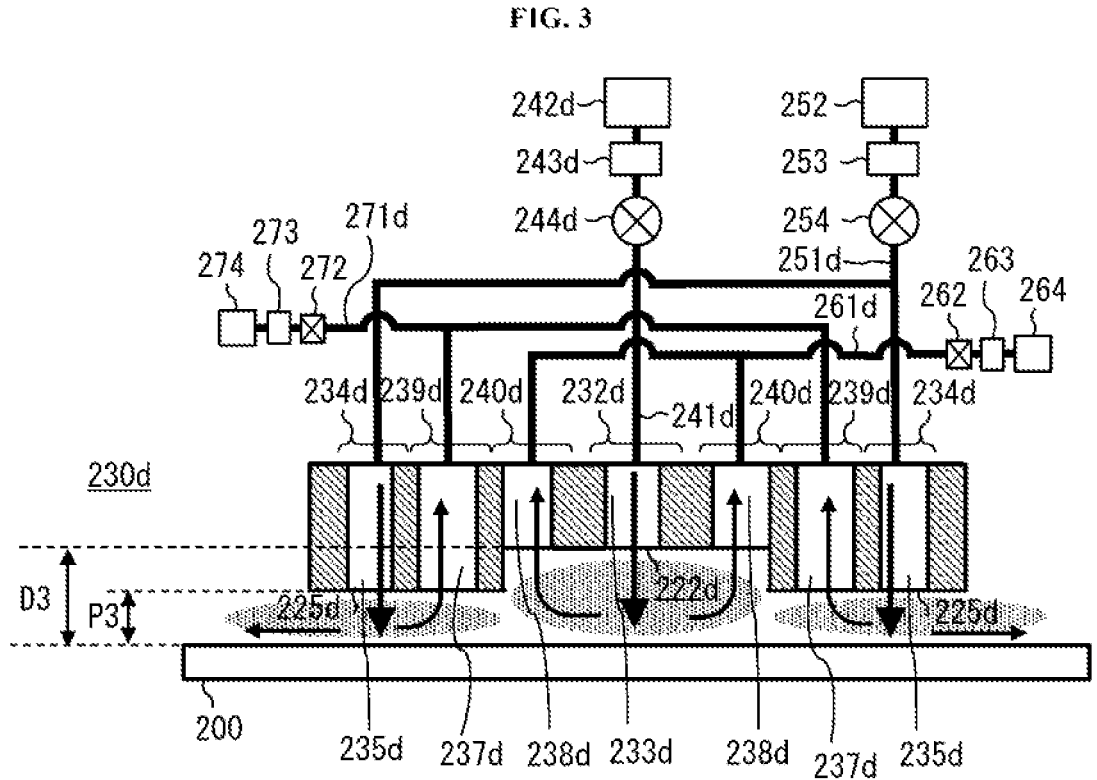
FIG. 3 illustrates the example of the main configuration of the substrate processing apparatus according to the first embodiment described herein in detail, in particular, schematically illustrates a vertical cross-section of the substrate processing apparatus taken along the line C-C of the substrate processing apparatus shown in FIG. 1.

FIG. 3 schematically illustrates a vertical cross-section of the substrate processing apparatus 100 taken along the line C-C shown in FIG. 1. In particular, FIG. 3 illustrates an exemplary configuration of the cartridge 230d in detail.

The cartridge 230d includes a reactive gas supplier 232d (hereinafter, also simply referred to as a "gas supplier 232d"). The gas supplier 232d is configured to supply a reactive gas onto the surface of the wafer 200 from above the substrate mounting table 210. The gas supplier 232d is provided with a reactive gas supply hole 233d (hereinafter, also simply referred to as a "gas supply hole 233d") which is a through-hole for the reactive gas. In addition, a reactive gas supply port 222d (hereinafter, also simply referred to as a "gas supply port 222d") is provided at a lower end of the gas supply hole 233d. In the present specification, a distance between the gas supply port 222d provided in the gas supplier 232d and the surface of the wafer 200 is referred to as a distance D3.

The cartridge 230d further includes a pair of reactive gas exhausters 240d (hereinafter, also simply referred to as "gas exhausters 240d") provided on both sides of the gas supplier 232d. Each of the gas exhausters 240d provided on both sides of the gas supplier 232d is configured to exhaust the reactive gas. Each of the gas exhausters 240d is provided with a reactive gas exhaust hole 238d (hereinafter, also simply referred to as a "gas exhaust hole 238d") which is a through-hole for the reactive gas.

The cartridge 230d further includes a pair of third inert gas suppliers 234d (hereinafter, also simply referred to as "gas suppliers 234d") provided on both sides of the pair of gas exhausters 240d. Each of the gas suppliers 234d provided on both sides of the gas supplier 232d is configured to supply the inert gas onto the surface of the wafer 200 from above the substrate mounting table 210. Each of the gas suppliers 234d is provided with a third inert gas supply hole 235d (hereinafter, also simply referred to as a "gas supply hole 235d") which is a through-hole for the inert gas. In addition, a third inert gas supply port 225d (hereinafter, also simply referred to as a "gas supply port 225d") is provided at a lower end of the gas supply hole 235d. In this specification, a distance between the gas supply port 225d provided in the gas suppliers 234d and the surface of the wafer 200 is referred to as a distance P3.

The cartridge 230d further includes a pair of third inert gas exhausters 239d (hereinafter, also simply referred to as "gas exhausters 239d") between the gas exhausters 240d and the gas suppliers 234d. Each of the gas exhausters 239d is configured to exhaust the inert gas. Each of the gas exhausters 239d is provided with a third inert gas exhaust hole 237d (hereinafter, also simply referred to as a "gas exhaust hole 237d") which is a through-hole for the inert gas.

As described above, each of the gas exhausters 239d is provided to exhaust the inert gas. For example, each of the gas exhausters 239d is configured by providing the third inert gas exhaust hole 237d (that is, the gas exhaust hole 237d) in a cartridge base (not shown) for the gas exhausters 239d.

As shown in FIGS. 2A and 2B, the distance D1 is greater than the distance D2. In addition, as shown in FIG. 2A, the distance P1 is smaller than the distance D1. In addition, as shown in FIG. 2B, the distance P2 is smaller than the distance D2. In addition, as shown in FIG. 3, the distance P3 is smaller than the distance D3.

<Gas Supply System>

Subsequently, a configuration of a gas supply system connected to each of the cartridges 230b, 230c and 230d will be described.

As shown in FIG. 2A, an adsorption inhibiting gas supply pipe 241b (hereinafter, also simply referred to as a "gas supply pipe 241b") is connected to the gas supply hole 233b of the gas supplier 232b. An adsorption inhibiting gas supply source 242b (hereinafter, also simply referred to as a "gas supply source 242b"), a mass flow controller (MFC) 243b serving as a flow rate controller (flow rate regulator) and a valve 244b serving as an opening/closing are sequentially provided at the gas supply pipe 241b in order from an upstream side to a downstream side of the gas supply pipe 241b. An adsorption inhibiting gas supply system is constituted mainly by the gas supply pipe 241b, the MFC 243b and the valve 244b. The adsorption inhibiting gas supply system may further include the gas supply source 242b. With the configuration of the adsorption inhibiting gas supply system described above, it is possible to supply the adsorption inhibiting gas onto the surface of the wafer 200 from above the substrate mounting table 210 via the gas supply hole 233b. In the present specification, the adsorption inhibiting gas refers to a gas capable of inhibiting the adsorption of the source gas onto the wafer 200. As the adsorption inhibiting gas, for example, carbon tetrafluoride ($CF_4$) gas may be used.

A downstream side of a first inert gas supply pipe 251b (hereinafter, also simply referred to as a "gas supply pipe 251b") is branched off and connected to the gas supply hole 235b of each of the gas suppliers 234b. An inert gas supply source 252 (hereinafter, also simply referred to as a "gas supply source 252"), a mass flow controller (MFC) 253 and a valve 254 are sequentially provided at the gas supply pipe 251*b* in order from an upstream side to a downstream side of the gas supply pipe 251*b*. A first inert gas supply system is constituted mainly by the gas supply pipe 251*b*, the MFC 253 and the valve 254. The first inert gas supply system may further include the gas supply source 252. With the configuration of the first inert gas supply system described above, it is possible to supply the inert gas onto the surface of the wafer 200 from above the substrate mounting table 210 via the gas supply hole 235*b*.

As shown in FIG. 2B, a source gas supply pipe 241*c* (hereinafter, also simply referred to as a "gas supply pipe 241*c*") is connected to the gas supply hole 233*c* of the gas supplier 232*c*. A source gas supply source 242*c* (hereinafter, also simply referred to as a "gas supply source 242*c*"), a mass flow controller (MFC) 243*c* and a valve 244*c* are sequentially provided at the gas supply pipe 241*c* in order from an upstream side to a downstream side of the gas supply pipe 241*c*. A source gas supply system is constituted mainly by the gas supply pipe 241*c*, the MFC 243*c* and the valve 244*c*. The source gas supply system may further include the gas supply source 242*c*. With the configuration of the source gas supply system described above, it is possible to supply the source gas onto the surface of the wafer 200 from above the substrate mounting table 210 via the gas supply hole 233*c*. As the source gas, for example, dichlorosilane (SiH$_2$Cl$_2$, abbreviated as DCS) gas may be used.

A downstream side of a second inert gas supply pipe 251*c* (hereinafter, also simply referred to as a "gas supply pipe 251*c*") is branched off and connected to the gas supply hole 235*c* of each of the gas suppliers 234*c*. The gas supply source 252, the mass flow controller (MFC) 253 and the valve 254 are sequentially provided at the gas supply pipe 251*c* in order from an upstream side to a downstream side of the gas supply pipe 251*c*. A second inert gas supply system is constituted mainly by the gas supply pipe 251*c*, the MFC 253 and the valve 254. The second inert gas supply system may further include the gas supply source 252. With the configuration of the second inert gas supply system described above, it is possible to supply the inert gas onto the surface of the wafer 200 from above the substrate mounting table 210 via the gas supply hole 235*c*.

As shown in FIG. 3, a reactive gas supply pipe 241*d* (hereinafter, also simply referred to as a "gas supply pipe 241*d*") is connected to the gas supply hole 233*d* of the gas supplier 232*d*. A reactive gas supply source 242*d* (hereinafter, also simply referred to as a "gas supply source 242*d*"), a mass flow controller (MFC) 243*d* and a valve 244*d* are sequentially provided at the gas supply pipe 241*d* in order from an upstream side to a downstream side of the gas supply pipe 241*d*. A reactive gas supply system is constituted mainly by the gas supply pipe 241*d*, the MFC 243*d* and the valve 244*d*. The reactive gas supply system may further include the gas supply source 242*d*. With the configuration of the reactive gas supply system described above, it is possible to supply the reactive gas onto the surface of the wafer 200 from above the substrate mounting table 210 via the gas supply hole 233*d*. As the reactive gas, for example, ammonia (NH$_3$) gas may be used.

A downstream side of a third inert gas supply pipe 251*d* (hereinafter, also simply referred to as a "gas supply pipe 251*d*") is branched off and connected to the gas supply hole 235*d* of each of the gas suppliers 234*d*. The gas supply source 252, the mass flow controller (MFC) 253 and the valve 254 are sequentially provided at the gas supply pipe 251*d* in order from an upstream side to a downstream side of the gas supply pipe 251*d*. A third inert gas supply system is constituted mainly by the gas supply pipe 251*d*, the MFC 253 and the valve 254. The third inert gas supply system may further include the gas supply source 252. With the configuration of the third inert gas supply system described above, it is possible to supply the inert gas onto the surface of the wafer 200 from above the substrate mounting table 210 via the gas supply hole 235*d*.

<Gas Exhaust System>

Subsequently, a configuration of a gas exhaust system connected to each of the cartridges 230*b*, 230*c* and 230*d* will be described.

As shown in FIG. 2A, an upstream side of an adsorption inhibiting gas exhaust pipe 261*b* (hereinafter, also simply referred to as a "gas exhaust pipe 261*b*") is branched off and connected to the gas exhaust hole 238*b* of each of the gas exhausters 240*b*. A valve 262 is provided at the gas exhaust pipe 261*b*. A pressure controller 263 configured to control a pressure of a space below the gas supplier 232*b* to a predetermined pressure is provided at a downstream side of the valve 262. A vacuum pump 264 is provided at a downstream side of the pressure controller 263. An adsorption inhibiting gas exhaust system is constituted mainly by the gas exhaust pipe 261*b*, the valve 262 and the pressure controller 263. The adsorption inhibiting gas exhaust system may further include the vacuum pump 264. With the configuration of the adsorption inhibiting gas exhaust system described above, it is possible to exhaust the adsorption inhibiting gas supplied onto the surface of the wafer 200 toward a space above the wafer 200 through the gas exhaust hole 238*b* of each of the gas exhausters 240*b*.

In addition, an upstream side of a first inert gas exhaust pipe 271*b* (hereinafter, also simply referred to as a "gas exhaust pipe 271*b*") is branched off and connected to the gas exhaust hole 237*b* of each of the gas exhausters 239*b*. A valve 272 is provided at the gas exhaust pipe 271*b*. A pressure controller 273 configured to control a pressure of a space below the gas suppliers 234*b* to a predetermined pressure is provided at a downstream side of the valve 272. A vacuum pump 274 is provided at a downstream side of the pressure controller 273. A first inert gas exhaust system is constituted mainly by the gas exhaust pipe 271*b*, the valve 272 and the pressure controller 273. The first inert gas exhaust system may further include the vacuum pump 274. With the configuration of the first inert gas exhaust system described above, it is possible to exhaust the inert gas supplied onto the surface of the wafer 200 toward the space above the wafer 200 through the gas exhaust hole 237*b* of each of the gas exhausters 239*b*.

As shown in FIG. 2B, an upstream side of a source gas exhaust pipe 261*c* (hereinafter, also simply referred to as a "gas exhaust pipe 261*c*") is branched off and connected to the gas exhaust hole 238*c* of each of the gas exhausters 240*c*. The valve 262 is provided at the gas exhaust pipe 261*c*. The pressure controller 263 configured to control a pressure of a space below the gas supplier 232*c* to a predetermined pressure is provided at the downstream side of the valve 262. The vacuum pump 264 is provided at the downstream side of the pressure controller 263. A source gas exhaust system is constituted mainly by the gas exhaust pipe 261*c*, the valve 262 and the pressure controller 263. The source gas exhaust system may further include the vacuum pump 264. With the configuration of the source gas exhaust system described above, it is possible to exhaust the source gas supplied onto the surface of the wafer 200 toward the space above the wafer 200 through the gas exhaust hole 238c of each of the gas exhausters 240c.

In addition, an upstream side of a second inert gas exhaust pipe 271c (hereinafter, also simply referred to as a "gas exhaust pipe 271c") is branched off and connected to the gas exhaust hole 237c of each of the gas exhausters 239c. The valve 272 is provided at the gas exhaust pipe 271c. The pressure controller 273 configured to control a pressure of a space below the gas suppliers 234c to a predetermined pressure is provided at the downstream side of the valve 272. The vacuum pump 274 is provided at the downstream side of the pressure controller 273. A second inert gas exhaust system is constituted mainly by the gas exhaust pipe 271c, the valve 272 and the pressure controller 273. The second inert gas exhaust system may further include the vacuum pump 274. With the configuration of the second inert gas exhaust system described above, it is possible to exhaust the inert gas supplied onto the surface of the wafer 200 toward the space above the wafer 200 through the gas exhaust hole 237c of each of the gas exhausters 239c.

As shown in FIG. 3, an upstream side of a reactive gas exhaust pipe 261d (hereinafter, also simply referred to as a "gas exhaust pipe 261d") is branched off and connected to the gas exhaust hole 238d of each of the gas exhausters 240d. The valve 262 is provided at the gas exhaust pipe 261d. The pressure controller 263 configured to control a pressure of a space below the gas supplier 232d to a predetermined pressure is provided at the downstream side of the valve 262. The vacuum pump 264 is provided at the downstream side of the pressure controller 263. A reactive gas exhaust system is constituted mainly by the gas exhaust pipe 261d, the valve 262 and the pressure controller 263. The reactive gas exhaust system may further include the vacuum pump 264. With the configuration of the reactive gas exhaust system described above, it is possible to exhaust the reactive gas supplied onto the surface of the wafer 200 toward the space above the wafer 200 through the gas exhaust hole 238d of each of the gas exhausters 240d.

In addition, an upstream side of a third inert gas exhaust pipe 271d (hereinafter, also simply referred to as a "gas exhaust pipe 271d") is branched off and connected to the gas exhaust hole 237d of each of the gas exhausters 239d. The valve 272 is provided at the gas exhaust pipe 271d. The pressure controller 273 configured to control a pressure of a space below the gas suppliers 234d to a predetermined pressure is provided at the downstream side of the valve 272. The vacuum pump 274 is provided at the downstream side of the pressure controller 273. A third inert gas exhaust system is constituted mainly by the gas exhaust pipe 271d, the valve 272 and the pressure controller 273. The third inert gas exhaust system may further include the vacuum pump 274. With the configuration of the third inert gas exhaust system described above, it is possible to exhaust the inert gas supplied onto the surface of the wafer 200 toward the space above the wafer 200 through the gas exhaust hole 237d of each of the gas exhausters 239d.

<Controller>

As shown in FIG. 1, the substrate processing apparatus 100 includes a controller 280 configured to control operations of the components of the substrate processing apparatus 100. The controller 280 includes at least an arithmetic processor 281 and a memory 282. The controller 280 is connected to the components of the substrate processing apparatus 100 described above, calls a program or a recipe from the memory 282 in accordance with an instruction from a host controller or a user, and controls the operations of the components of the substrate processing apparatus 100 in accordance with the contents of the instruction. Specifically, the controller 280 may be configured to control the operations of the components such as the rotator (not shown), the heater (not shown), a high frequency power supply (not shown), a matcher (not shown), the MFCs 243b, 243c, 243d and 253, the valves 244b, 244c, 244d, 254, 262 and 272, the vacuum pumps 264 and 274, and an elevator 500 described later.

The controller 280 may be embodied by a dedicated computer or by a general-purpose computer. For example, the controller 280 may be embodied by preparing an external memory 283 storing the program described above and by installing the program onto the general-purpose computer using the external memory 283. For example, the external memory 283 may include a magnetic tape, a magnetic disk such as a flexible disk and a hard disk, an optical disk such as a CD and a DVD, a magneto-optical disk such as an MO and a semiconductor memory such as a USB memory and a memory card.

The means for providing the program to the computer is not limited to the external memory 283. For example, the program may be supplied to the computer (general-purpose computer) using communication means such as the Internet and a dedicated line. In addition, the memory 282 or the external memory 283 may be embodied by a non-transitory computer readable recording medium. Hereafter, the memory 282 and the external memory 283 may be individually or collectively referred to as the recording medium. In the present specification, the term "recording medium" may refer to only the memory 282, may refer to only the external memory 283 or may refer to both of the memory 282 and the external memory 283.

(2) Substrate Processing

Subsequently, a substrate processing of processing the wafer 200, which is a part of the manufacturing processes of the semiconductor device, will be described. The substrate processing is performed by using the above-described substrate processing apparatus 100. Hereinafter, the substrate processing will be described by way of an example in which a film is formed on the wafer 200. In particular, according to the present embodiment, for example, the $CF_4$ gas is used as the adsorption inhibiting gas, the DCS gas is used as the source gas, and the $NH_3$ gas is used as the reactive gas. The substrate processing according to the present embodiment will be described by way of an example in which a silicon nitride film (also simply referred to as an "SiN film") is formed on the wafer 200 by alternately supplying the DCS gas and the $NH_3$ gas onto the wafer 200.

In the following descriptions, in the substrate processing, the operations of the components constituting the substrate processing apparatus 100 are controlled by the controller 280. In addition, according to the present embodiment, for example, a silicon (Si) wafer is used as the wafer 200, and a recess (which is a concave portion) such as a trench and a hole is provided on the surface of the wafer 200.

<Substrate Loading Step S101>

In the substrate processing apparatus 100, first, as the substrate loading step S101, the substrate loading/unloading port of the process vessel is opened, and the plurality of the wafers (for example, five wafers) including the wafer 200 are loaded into the process vessel by using a wafer transport device (not shown). The plurality of the wafers are arranged and placed one by one on the substrate mounting table 210. Then, the wafer transport device is retracted to the outside of the process vessel, and the substrate loading/unloading port is closed to seal (close) the inside of the process vessel.

<Pressure and Temperature Adjusting Step S102>

After the substrate loading step S101 is completed, the pressure and temperature adjusting step S102 is performed. In the pressure and temperature adjusting step S102, after the process vessel is sealed in the substrate loading step S101, the gas exhaust system connected to the process vessel is operated to control an inner pressure of the process vessel to a predetermined pressure. The predetermined pressure in the pressure and temperature adjusting step S102 refers to a process pressure at which the SiN film can be formed in a film-forming step S103 described later, and specifically, for example, a process pressure at which the source gas supplied to the wafer 200 is not self-decomposed. Specifically, the process pressure may be set to a pressure ranging from 10 Pa to 9,000 Pa. The process pressure is also maintained in the film-forming step S103 described below.

In addition, in the pressure and temperature adjusting step S102, the electric power is supplied to the heater embedded in the substrate mounting table 210 such that a surface temperature of the wafer 200 is adjusted to a predetermined temperature. In the pressure and temperature adjusting step S102, a temperature of the heater is adjusted by controlling a state of the electric conduction to the heater based on temperature information detected by a temperature sensor (not shown). In the pressure and temperature adjusting step S102, the predetermined temperature refer to a process temperature at which the SiN film can be formed in the film-forming step S103 described later, and specifically, for example, a process temperature at which the source gas supplied to the wafer 200 is not self-decomposed. Specifically, the process temperature may be set to a pressure ranging from room temperature to 750° C., preferably, from the room temperature to 650° C. The process temperature is also maintained in the film-forming step S103 described below.

<Film-Forming Step S103>

After the pressure and temperature adjusting step S102 is completed, the film-forming step (film-forming process) S103 is performed. Processing operations of the substrate processing apparatus 100 performed in the film-forming step S103 are roughly classified into a relative position movement processing operation and a gas supply and/or exhaust processing operation. The processing operations in the film-forming step S103 are performed concurrently.

First, the relative position movement processing operation will be described.

According to the relative position movement processing operation, by rotationally driving the substrate mounting table 210 by the rotator (not shown), a position of each of the cartridges 230b, 230c and 230d of the cartridge head 230 are relatively moved with respect to the substrate mounting table 210. That is, a relative movement between the substrate mounting table 210 and the cartridges 230b, 230c and 230d of the cartridge head 230 is started. As a result, each of the plurality of the wafers including the wafer 200 placed on the substrate mounting table 210 sequentially passes through regions under the cartridges 230b, 230c and 230d of the cartridge head 230.

Subsequently, the gas supply and/or exhaust processing operation will be described.

According to the gas supply and/or exhaust processing operation, the adsorption inhibiting gas (CF$_4$ gas) is supplied through the gas supply port 222b of the cartridge 230b, the source gas (DCS gas) is supplied through the gas supply port 222c of the cartridge 230c, and the reactive gas (NH$_3$ gas) is supplied through the gas supply port 222d of the cartridge 230d. The gases supplied through the gas supply ports 222b, 222c and 222d are exhausted toward the space above the wafer 200 through the gas exhaust holes 238b, 238c and 238d by opening the valve 262 while operating the vacuum pump 264. In addition, while the gases are being supplied through the gas supply ports 222b, 222c and 222d, the inert gas (N$_2$ gas) is supplied through each of the gas supply port 225b of the cartridge 230b, the gas supply port 225c of the cartridge 230c and the gas supply port 225d of the cartridge 230d. The inert gas supplied through each of the gas supply ports 225b, 225c and 225d is exhausted toward the space above the wafer 200 through the gas exhaust holes 237b, 237c and 237d by opening the valve 272 while operating the vacuum pump 274.

By concurrently performing the two operations of the relative position movement processing operation and the gas supply and/or exhaust processing operation in parallel as described above, with respect to the wafer 200, a cycle in which a step of supplying the adsorption inhibiting gas to the wafer 200 (hereinafter, also referred to as a "step (A)"), a step of supplying the source gas to the wafer 200 (hereinafter, also referred to as a "step (B)") and a step of supplying the reactive gas to the wafer 200 (hereinafter, also referred to as a "step (C)") are sequentially performed in order with a step of purging the surface of the wafer 200 interposed therebetween is performed a predetermined number of times.

Figures 4A, 4B, 4C:
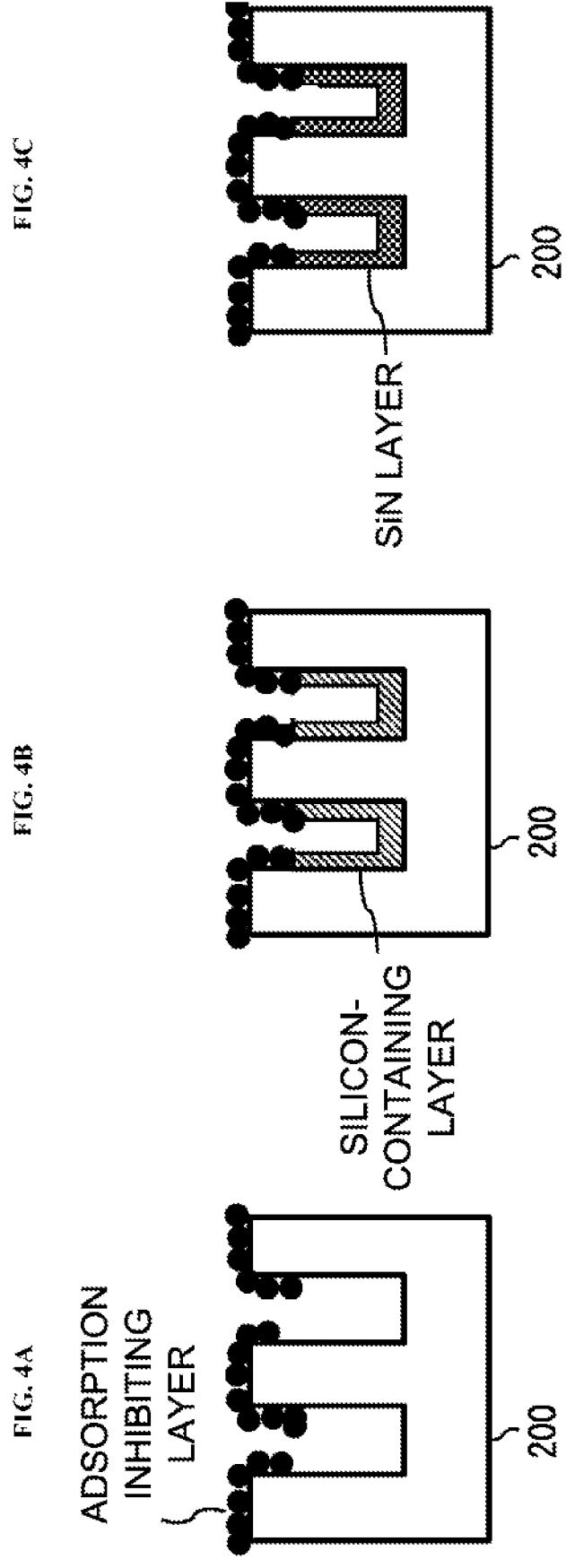
FIGS. 4A through 4C schematically illustrate a surface of a wafer when an exemplary film-forming step according to the first embodiment described herein is performed, FIG. 4A schematically illustrates the surface of the wafer when an adsorption inhibiting layer is formed on the surface of the wafer, FIG. 4B schematically illustrates the surface of the wafer when a source gas is adsorbed on the surface of the wafer, and FIG. 4C schematically illustrates the surface of the wafer when a silicon-containing layer is modified by a modification gas.

In the step (A), the CF$_4$ gas is supplied onto the surface of the wafer 200. When the CF$_4$ gas is supplied, the silicon exposed on the surface of the wafer 200 reacts with the CF$_4$ gas to form a fluorine (F)-terminated (SiF-terminated) adsorption inhibiting layer on the surface of the wafer 200. As described above, the distance D1 is greater than the distance D2. Therefore, in the step (A), for example, the CF$_4$ gas is supplied at a pressure lower than a pressure of the DCS gas supplied in the step (B) described later. That is, the CF$_4$ gas at a relatively low pressure is supplied with respect to the wafer 200. Therefore, the CF$_4$ gas hardly reaches a bottom of the recess of the wafer 200, and is adsorbed only in the vicinity of an opening of the recess of the wafer 200. As a result, the adsorption inhibiting layer is formed only in the vicinity of the opening of the recess of the wafer 200 (refer to FIG. 4A). In addition, for example, a passage time of the cartridge 230b with respect to the surface of the wafer 200 (that is, a supply time of the CF$_4$ gas) may be adjusted (set) to 0.1 second to 20 seconds (preferably, 0.1 second to 9 seconds).

In addition, a concentration of the adsorption inhibiting gas is preferably lower than at least a concentration of the source gas. In the present specification, a gas concentration relationship described above is referred to as a "low gas concentration". The concentration of the gas such as the adsorption inhibiting gas depends on a flow rate and/or a pressure of the gas. That is, it is possible to lower the concentration of the gas by lowering the flow rate of the gas, by lowering the pressure of the gas or by lowering both of the flow rate of the gas and the pressure of the gas. As described above, the adsorption inhibiting gas is supplied to the wafer 200 at the low gas concentration. As a result, the adsorption inhibiting gas is consumed in the vicinity of the opening of the recess of the wafer 200, the adsorption inhibiting gas hardly reaches the bottom of the recess, and the adsorption inhibiting layer is formed only in the vicinity of the opening of the recess of the wafer 200. According to the present embodiment, the consumption of the adsorption inhibiting gas means that the adsorption inhibiting gas is adsorbed to the wafer 200, that is, molecules of the adsorption inhibiting gas are adsorbed on the surface of the recess in the vicinity of the opening of the recess of the wafer 200. The concentration of the adsorption inhibiting gas adsorbed in the vicinity of the bottom of the recess is set such that an amount of the adsorption inhibiting gas adsorbed in the vicinity of the bottom of the recess is smaller than an amount of the source gas described later adsorbed in the vicinity of the bottom of the recess. The molecules of the adsorption inhibiting gas to be adsorbed may include the molecules of the adsorption inhibiting gas itself and molecules generated by partially decomposing the molecules of the adsorption inhibiting gas.

In addition, while the present embodiment is described by way of an example in which the adsorption inhibiting gas is supplied to the wafer 200 at the low gas concentration, the present embodiment is not limited thereto. For example, instead of or in addition to the low gas concentration, by changing a flow velocity of the gas such as the adsorption inhibiting gas, an atmosphere similar to the low gas concentration may be obtained. By reducing the flow velocity of the gas, the gas is consumed in the vicinity of the opening of the recess before reaching the bottom of the recess.

In the step (B), the DCS gas is supplied onto the surface of the wafer 200. The DCS gas supplied reaches the surface of the wafer 200 at a wafer processing position. As a result, a silicon-containing layer containing chlorine (Cl) is formed on the surface of the wafer 200 on which the adsorption inhibiting layer is not formed (refer to FIG. 4B). As described above, the distance D2 is smaller than the distance D1. Therefore, in the step (B), the DCS gas is supplied at a pressure higher than the pressure of the $CF_4$ gas supplied in the step (A) described above. That is, the DCS gas at a relatively high pressure is supplied with respect to the wafer 200. Therefore, the DCS gas reaches the bottom of the recess of the wafer 200 through the opening of the recess of the wafer 200. However, since the adsorption inhibiting layer is formed in the vicinity of the opening of the recess of the wafer 200, the DCS gas is adsorbed only in the vicinity of the bottom of the recess. As a result, the silicon-containing layer is formed only in the vicinity of the bottom of the recess of the wafer 200 (refer to FIG. 4B). As described above, in the step (B), it is possible to selectively form the silicon-containing layer on the surface of the wafer 200 such as the bottom of the recess where no adsorption inhibiting layer is formed while suppressing the formation of the silicon-containing layer on the surface of the wafer 200 such as the vicinity of the opening of the recess where the adsorption inhibiting layer is formed. Since the fluorine-terminated adsorption inhibiting layer existing in the vicinity of the opening of the recess of the wafer 200 inhibits the formation of the silicon-containing layer (that is, the adsorption of silicon) in the vicinity of the opening of the recess of the wafer 200, that is, the fluorine-terminated adsorption inhibiting layer acts as an inhibitor, it is possible to selectively form the silicon-containing layer on the surface of the wafer 200. In addition, for example, a passage time of the cartridge 230c with respect to the surface of the wafer 200 (that is, a supply time of the DCS gas) may be adjusted (set) to 0.1 second to 20 seconds (preferably, 0.1 second to 9 seconds).

In addition, the concentration of the source gas is preferably higher than at least the concentration of the adsorption inhibiting gas. In the present specification, a gas concentration relationship described above is referred to as a "high gas concentration". The concentration of the gas such as the source gas depends on the flow rate and/or the pressure of the gas such as the source gas. That is, it is possible to increase the concentration of the gas by increasing the flow rate of the gas, by increasing the pressure of the gas or by increasing both of the flow rate of the gas and the pressure of the gas. As described above, the source gas is supplied to the wafer 200 at the high gas concentration. As a result, even when the source gas is consumed in the vicinity of the opening of the recess of the wafer 200, molecules of the source gas may reach the bottom of the recess. As described above, since the adsorption inhibiting gas is adsorbed in the vicinity of the opening of the recess, it is possible to reduce the amount of the source gas consumed in the vicinity of the opening of the recess, and it is also possible to increase the amount of the source gas supplied to the bottom of the recess.

In addition, while the present embodiment is described by way of an example in which the source gas is supplied to the wafer 200 at the high gas concentration, the present embodiment is not limited thereto. For example, instead of or in addition to the high gas concentration, by changing the flow velocity of the gas such as the source gas, an atmosphere similar to the high gas concentration may be obtained. By increasing the flow velocity of the gas, the gas is supplied to the bottom of the recess before the gas is consumed in the vicinity of the opening of the recess.

In the step (C), the $NH_3$ gas is supplied onto the surface of the wafer 200. The $NH_3$ gas supplied reaches the surface of the wafer 200 at the wafer processing position. As a result, at least a part of the silicon-containing layer formed on the surface of the wafer 200 is nitrided (modified). By modifying the silicon-containing layer, a layer containing silicon and nitrogen (N), that is, a silicon nitride layer (also simply referred to as an "SiN layer") is formed on the surface of the wafer 200. As described above, since the silicon-containing layer is formed only in the vicinity of the bottom of the recess of the wafer 200, the SiN layer is formed only in the vicinity of the bottom of the wafer 200 (refer to FIG. 4C). In addition, for example, a passage time of the cartridge 230d with respect to the surface of the wafer 200 (that is, a supply time of the $NH_3$ gas) may be adjusted (set) to 0.1 second to 20 seconds (preferably, 0.1 second to 9 seconds).

By performing the cycle described above a predetermined number of times by continuously performing the relative position movement processing operation and the gas supply and/or exhaust processing operation for a predetermined time, the SiN film of a desired thickness formed by stacking the SiN layer described above is formed on the wafer 200. When the SiN film is formed, an inside of the recess formed on the surface of the wafer 200 is gradually filled with the SiN film from the bottom toward the opening (hereinafter, in the present specification, such a filling process is referred to as a "bottom-up film-forming process"). When the number of times of performing the cycle is increased and the inside of the recess formed on the surface of the wafer 200 is gradually filled with the SiN film, the $CF_4$ gas may be supplied into the recess. As a result, it may reduce the productivity of the filling process or it may be difficult to progress the filling process. In such a case, it is preferable to reduce a supply flow rate of the $CF_4$ gas or to stop the supply of the $CF_4$ gas in accordance with a predetermined condition such as the progress of the filling process. When the supply of the $CF_4$ gas is stopped, it is preferable to supply the inert gas such as the $N_2$ gas through the gas supplier 232b.

When the filling process of filling the SiN film into the recess is completed, the gas supply and/or exhaust processing operation are terminated. Thereafter, the rotator stops the relative position movement between the substrate mounting table 210 and the cartridges 230b, 230c and 230d of the cartridge head 230. As a result, the relative position movement processing operation is terminated.

<Substrate Unloading Step S104>

After the film-forming step S103 is completed, the substrate unloading step S104 is performed by the substrate processing apparatus 100. In the substrate unloading step S104, the plurality of the processed wafers including the wafer 200 are transferred (unloaded) out of the process vessel in the order reverse to that of the substrate loading step S101.

(3) Effects Acording to Present Embodiment

According to the present embodiment described above, it is possible to provide one or more of the following effects.

(A) According to the present embodiment, as shown in FIGS. 2A and 2B, the distance D1 is greater than the distance D2. Therefore, in the step (A), the adsorption inhibiting gas ($CF_4$ gas) is supplied to the wafer 200 at the relatively low pressure as described above. As a result, the $CF_4$ gas hardly reaches the bottom of the recess of the wafer 200, and is adsorbed only in the vicinity of the opening of the recess of the wafer 200. As a result, the adsorption inhibiting layer is formed only in the vicinity of the opening of the recess of the wafer 200 (refer to FIG. 4A).

As described above, the distance D2 is smaller than the distance D1. Therefore, in the step (B), the source gas (DCS gas) is supplied to the wafer 200 at the relatively high pressure as described above. Therefore, the DCS gas reaches the bottom of the recess of the wafer 200 through the opening of the recess of the wafer 200. However, since the adsorption inhibiting layer is formed in the vicinity of the opening of the recess of the wafer 200, the DCS gas is adsorbed only in the vicinity of the bottom of the recess. As a result, the silicon-containing layer is formed only in the vicinity of the bottom of the recess of the wafer 200 (refer to FIG. 4B). As described above, in the step (C), since the reactive gas ($NH_3$ gas) nitrides the silicon-containing layer, the SiN layer is formed only in the vicinity of the bottom of the wafer 200 (refer to FIG. 4C).

As described above, by performing the cycle described above, the SiN film can be gradually filled from the bottom of the recess of the wafer 200 toward the opening of the recess of the wafer 200. That is, it is possible to perform the bottom-up film-forming process described above. As a result, it is possible to improve the filling property of the SiN film in the recess formed on the surface of the wafer 200.

(B) According to the present embodiment, as shown in FIG. 2A, the distance P1 is smaller than the distance D1. Therefore, the inert gas ($N_2$ gas) is supplied to the wafer 200 at a pressure higher than the pressure of the $CF_4$ gas. Thereby, in the cartridge 230b, the pressure of the space below the gas suppliers 234b is higher than the pressure of the space below the gas supplier 232b. As a result, it is possible to reliably exhibit an air-sealing effect of the $N_2$ gas, and it is also possible to reliably suppress the leakage of the $CF_4$ gas from the space below the cartridge 230b.

(C) According to the present embodiment, as shown in FIG. 2B, the distance P2 is smaller than the distance D2. Therefore, the inert gas ($N_2$ gas) is supplied to the wafer 200 at a pressure higher than the pressure of the DCS gas. Thereby, in the cartridge 230c, the pressure of the space below the gas suppliers 234c is higher than the pressure of the space below the gas supplier 232c. As a result, it is possible to reliably exhibit the air-sealing effect of the $N_2$ gas, and it is also possible to reliably suppress the leakage of the DCS gas from the space below the cartridge 230c.

(D) According to the present embodiment, as shown in FIG. 3, the distance P3 is smaller than the distance D3. Therefore, the inert gas ($N_2$ gas) is supplied to the wafer 200 at a pressure higher than the pressure of the $NH_3$ gas. Thereby, in the cartridge 230d, the pressure of the space below the gas suppliers 234d is higher than the pressure of the space below the gas supplier 232d. As a result, it is possible to reliably exhibit the air-sealing effect of the $N_2$ gas, and it is also possible to reliably suppress the leakage of the $NH_3$ gas from the space below the cartridge 230d.

Second Embodiment of Technique

Figure 5:
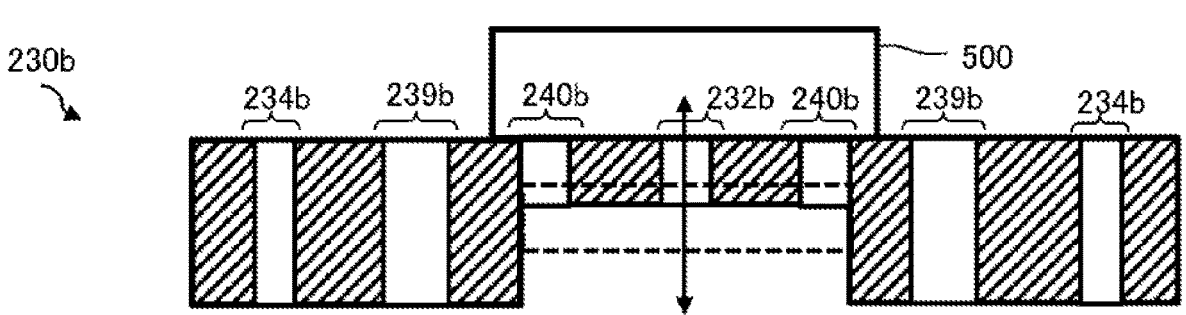
FIG. 5 schematically illustrates an example of a main configuration of a substrate processing apparatus according to a second embodiment described herein.

Hereinafter, a second embodiment according to the technique of the present disclosure will be described with reference to FIG. 5.

As described above, when the number of times of performing the cycle is increased and the inside of the recess formed on the surface of the wafer 200 is gradually filled with the SiN film, by supplying the $CF_4$ gas into the recess, it may reduce the productivity of the filling process or it may be difficult to progress the filling process. According to the present embodiment, instead of reducing the supply flow rate of the $CF_4$ gas or stopping the supply of the $CF_4$ gas in accordance with the predetermined condition such as the progress of the filling process, it is possible to address the problems described above by changing the distance D1. Hereinafter, the present embodiment will be described in detail.

The substrate processing apparatus 100 according to the present embodiment is different from the substrate processing apparatus 100 according to the first embodiment described above in that, as shown in FIG. 5, the elevator 500 serving as an elevating mechanism configured to elevate or lower the gas supplier 232b is provided in the cartridge 230b. Hereinafter, the film-forming process of forming the film using the elevator 500 will be described below.

In order to perform the filling process of the SiN film into the recess of the wafer 200, the source gas (DCS gas) is adsorbed to the bottom of the recess of the wafer 200 in an initial stage of the cycle described above. Therefore, according to the present embodiment, the $CF_4$ gas is supplied to the wafer 200 at the relatively high pressure as described above in order to adsorb the $CF_4$ gas in vicinity of the bottom of the recess of the wafer 200 in the initial stage of the cycle. Specifically, in the initial stage of the cycle described above, the elevator 500 is operated to move the gas supplier 232b to a lower position such that the distance D1 is reduced. However, a lower limit of the distance D1 is set to a distance at which the $CF_4$ gas is not adsorbed on the bottom of the recess of the wafer 200.

On the other hand, when the distance D1 remains reduced even when the filling process is advanced in a middle stage or a final stage of the cycle described above, the $CF_4$ gas is adsorbed on the surface of the SiN film which is formed to fill the recess. As a result, the filling process may not be progressed after the $CF_4$ gas is adsorbed on the surface of the SiN film. Therefore, according to the present embodiment, in the middle stage or the final stage of the cycle, the $CF_4$ gas is gradually adsorbed to a shallow location of the recess of the wafer 200 in accordance with the predetermined condition such as the progress of the filling process of filling the SiN film into the recess of the wafer 200. Specifically, in the middle stage or the final stage of the cycle, the elevator 500 is operated to gradually move the gas supplier 232b to a higher position in accordance with the predetermined condition such as the progress of the filling process of filling the SiN film into the recess of the wafer 200. As a result, the distance D1 is increased.

As described above, by adjusting the distance D1 in accordance with the predetermined condition such as the progress of the filling process of filling the SiN film into the recess of the wafer 200, the $CF_4$ gas is adsorbed in the vicinity of the bottom of the recess of the wafer 200 in the initial stage of the cycle, and the $CF_4$ gas is gradually adsorbed to the shallow location of the recess of the wafer 200 in the middle stage or the final stage of the cycle. As a result, it is possible to progress the filling process without reducing the supply flow rate of the adsorption inhibiting gas or stopping the supply of the adsorption inhibiting gas.

In addition, by adjusting the distance D1 by operating the elevator 500, it is also possible to adjust the distance D1 with respect to each of the plurality of the wafers including the wafer 200 in accordance with a depth of the recess or a width of the opening of the recess of each of the plurality of the wafers. Therefore, according to the present embodiment, by setting (adjusting) an optimum distance D1 in advance in accordance with the depth of the recess or the width of the opening of each of the plurality of the wafers including the wafer 200, it is possible to progress the filling process without reducing the supply flow rate of the adsorption inhibiting gas or stopping the supply of the adsorption inhibiting gas.

In addition, according to the present embodiment, it is also possible to reduce the supply flow rate of the $CF_4$ gas or to stop the supply of the $CF_4$ gas in accordance with the predetermined condition such as the progress of the filling process. When the supply of the $CF_4$ gas is stopped, it is preferable to supply the inert gas such as the $N_2$ gas through the gas supplier 232b. When the $N_2$ gas is supplied through the gas supplier 232b, it is preferable to adjust (set) the distance D1 is reduced.

Other Embodiments of Technique

While the technique of the present disclosure is described by way of the above-described first embodiment and the second embodiment, the above-described technique is not limited thereto. The above-described technique may be modified in various ways without departing from the gist thereof.

For example, while the above-described embodiments are described by way of an example in which the adsorption inhibiting gas ($CF_4$ gas) is supplied at the same number of times when performing the cycle described above a predetermined number of times, the above-described technique is not limited thereto. For example, the $CF_4$ gas may be supplied once when the cycle described above is performed a plurality of times. In such a case, it is possible to obtain the same effects as those of the above-described embodiments.

For example, while the above-described embodiments are described by way of an example in which the substrate mounting table 210 is rotationally driven by the rotator, the above-described technique is not limited thereto. For example, the cartridge head 230 may be rotationally driven by the rotator as long as the position of each of the cartridges 230b, 230c and 230d of the cartridge head 230 is relatively moved with respect to the substrate mounting table 210. In such a case, it is possible to obtain the same effects as those of the above-described embodiments. When the cartridge head 230 is rotationally driven, it is possible to suppress a moment of inertia acting on the wafer 200 as compared to a case in which the substrate mounting table 210 is rotationally driven. In addition, it is preferable in that it is possible to increase a rotation speed. However, the above-described case in which the substrate mounting table 210 is rotationally driven may be advantageous in that it is possible to simplify configurations of components such as a gas piping.

Figure 6:
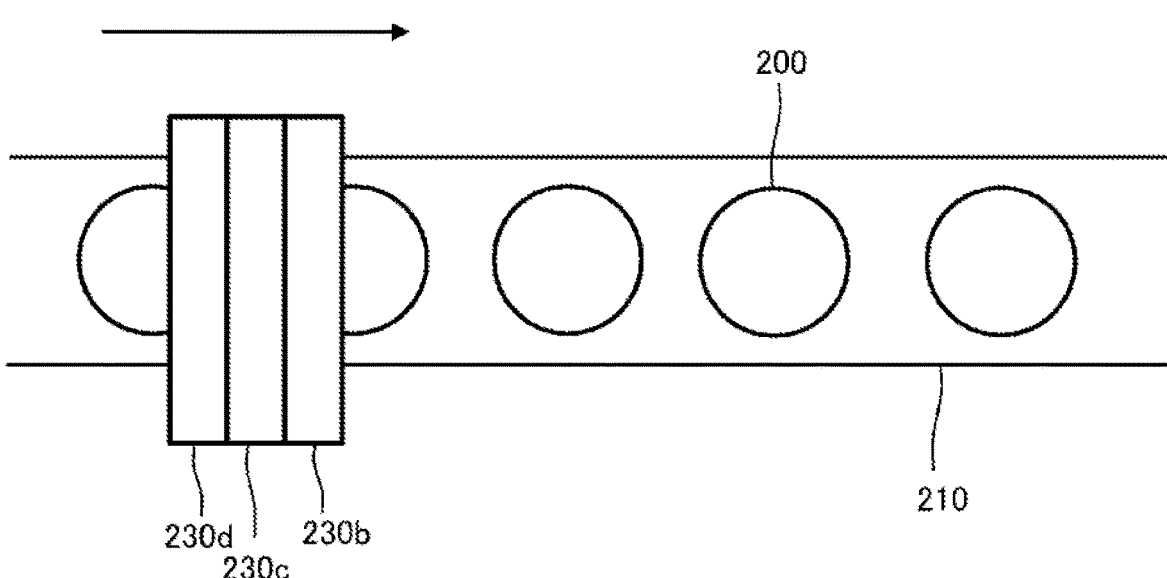
FIG. 6 schematically illustrates an example of a main configuration of a substrate processing apparatus according to another embodiment described herein.

For example, while the above-described embodiments are described by way of an example in which the substrate mounting table 210 is rotationally driven by the rotator around the center position of the substrate mounting table 210 as the rotation axis, the above-described technique is not limited thereto. For example, as shown in FIG. 6, a substrate mounting table 210 in which the plurality of wafers including the wafer 200 are aligned in a line may be used. That is, the substrate mounting table 210 configured to move horizontally in one direction or reciprocally may be used so that the plurality of wafers including the wafer 200 linearly move below each of the cartridges 230b, 230c and 230d. In such a case, it is also possible to obtain the same effects as those of the above-described embodiments.

For example, while the above-described embodiments are described by way of an example in which the cartridge 230b provided with the gas suppliers 234b is used, the above-described technique is not limited thereto. For example, a cartridge 230b without the gas suppliers 234b may be used. Similarly, instead of the cartridge 230c provided with the gas suppliers 234c, a cartridge 230c without the gas suppliers 234c may be used. Similarly, instead of the cartridge 230c provided with the cartridge 230d, a cartridge 230d without the gas suppliers 234d may be used. In such cases, it is also possible to obtain the same effects as those of the above-described embodiments.

In addition, for example, the matcher (not shown) and the high frequency power supply (not shown) may be connected to the cartridge 230d among the cartridges 230b, 230c and 230d. In such a case, the plasma is generated in the space below the cartridge 230d by adjusting the impedance with the high frequency power supply and the matcher. In such the case, it is also possible to obtain the same effects as those of the above-described embodiments.

For example, while the above-described embodiments are described by way of an example in which the $CF_4$ gas is used as the adsorption inhibiting gas, the above-described technique is not limited thereto. For example, instead of the $CF_4$ gas, a gas such as a gas containing halogen, a gas containing halogen radicals and a gas containing a plurality of carbon elements may be used as the adsorption inhibiting gas. Specifically, for example, a gas obtained by activating the $CF_4$ gas describe above, chlorine trifluoride ($ClF_3$) gas and $Cl_2$ gas with the plasma may be used. In such a case, it is also possible to obtain the same effects as those of the above-described embodiments.

For example, while the above-described embodiments are described by way of an example in which an inorganic gas is used as the adsorption inhibiting gas, the above-described technique is not limited thereto. For example, an organic gas may be used as the adsorption inhibiting gas. As the organic gas, a material capable of forming a self-assembled monolayer (SAM) may be used. As the material, for example, a carboxylic acid material, a phosphonic acid material, a thiol material, a silylamine material, a chlorosilane material or an oxysilane material may be used. In such a case, it is also possible to obtain the same effects as those of the above-described embodiments.

For example, while the above-described embodiments are described by way of an example in which the SiN film is formed on the wafer 200 as the film, the above-described technique is not limited thereto. For example, the above-described technique may be applied when a film containing at least one element such as aluminum (Al), hafnium (Hf), zirconium (Zr), titanium (Ti), molybdenum (Mo) and ruthenium (Ru) is formed. In addition, the above-described technique may be applied a processing apparatus configured to form the film containing at least one element such as an oxide film, a nitride film, an oxynitride film, a carbide film, a carbonitride film and oxycarbide film. In such a case, it is also possible to obtain the same effects as those of the above-described embodiments.

Preferred Embodiments of Technique

Preferred embodiments of the technique will be supplementarily described below.

<Supplementary Note 1>

According to one aspect of the technique described herein, there is provided a substrate processing apparatus including: a substrate mounting table on which a substrate is placed; an adsorption inhibiting gas supplier configured to supply an adsorption inhibiting gas onto a surface of the substrate from above the substrate mounting table; and a source gas supplier configured to supply a source gas onto the surface of the substrate from above the substrate mounting table, wherein a distance D1 between a gas supply port provided in the adsorption inhibiting gas supplier and the substrate is greater than a distance D2 between a gas supply port provided in the source gas supplier and the substrate.

<Supplementary Note 2>

Preferably, the substrate processing apparatus of Supplementary note 1 further includes: first inert gas suppliers provided on both sides of the adsorption inhibiting gas supplier and configured to supply an inert gas onto the surface of the substrate from above the substrate mounting table, wherein a distance P1 between a gas supply port provided in the first inert gas suppliers and the substrate is smaller than the distance D1.

<Supplementary Note 3>

Preferably, the substrate processing apparatus of Supplementary note 1 or Supplementary note 2 further includes: second inert gas suppliers provided on both sides of the source gas supplier and configured to supply an inert gas onto the surface of the substrate from above the substrate mounting table, wherein a distance P2 between a gas supply port provided in the second inert gas suppliers and the substrate is smaller than the distance D2

<Supplementary Note 4>

Preferably, the substrate processing apparatus of any one of Supplementary notes 1 through 3 further includes: an elevator configured to elevate or lower the adsorption inhibiting gas supplier to change the distance D1.

<Supplementary Note 5>

Preferably, the substrate processing apparatus of Supplementary note 4 further includes: a controller configured to: control the adsorption inhibiting gas supplier and the source gas supplier to perform a film-forming process in which a cycle including (a) supplying the adsorption inhibiting gas to the substrate with a recess formed on the surface thereof and (b) supplying the source gas to the substrate is performed a predetermined number of times; and control the elevator to reduce or increase the distance D1 while the film-forming process is being performed.

<Supplementary Note 6>

Preferably, the substrate processing apparatus of Supplementary note 4 further includes: a controller configured to control the elevator to adjust the distance D1 in accordance with a depth of a recess formed on the surface of the substrate or a width of an opening of the recess.

<Supplementary Note 7>

Preferably, the substrate processing apparatus of any one of Supplementary notes 1 through 6 further includes: a controller configured to: control the adsorption inhibiting gas supplier and the source gas supplier to perform a cycle including (a) supplying the adsorption inhibiting gas to the substrate with a recess formed on the surface thereof and (b) supplying the source gas to the substrate is performed a predetermined number of times; and stop a supply of the adsorption inhibiting gas but continue a supply of the source gas when the recess is filled to meet a predetermined condition.

<Supplementary Note 8>

Preferably, in the substrate processing apparatus of Supplementary note 7, the controller is further configured to control the adsorption inhibiting gas supplier to supply an inert gas through the adsorption inhibiting gas supplier when the supply of the adsorption inhibiting gas is stopped but the supply of the source gas is continued.

<Supplementary Note 9>

According to another aspect of the technique described herein, there is provided a method of manufacturing a semiconductor device including:

(a) placing a substrate on a substrate mounting table;

(b) forming a film on the substrate by (b-1) supplying an adsorption inhibiting gas onto a surface of the substrate through an adsorption inhibiting gas supplier provided above the substrate mounting table and (b-2) supplying a source gas onto the surface of the substrate through an source gas supplier provided above the substrate mounting table, wherein a distance D1 between a gas supply port provided in the adsorption inhibiting gas supplier and the substrate in (b) is greater than a distance D2 between a gas supply port provided in the source gas supplier and the substrate in (b).

<Supplementary Note 10>

According to still another aspect of the technique described herein, there is provided a program related to a substrate processing apparatus, wherein the program causes, by a computer, the substrate processing apparatus to perform:

(a) placing a substrate on a substrate mounting table;

(b) forming a film on the substrate by (b-1) supplying an adsorption inhibiting gas onto a surface of the substrate through an adsorption inhibiting gas supplier provided above the substrate mounting table and (b-2) supplying a source gas onto the surface of the substrate through an source gas supplier provided above the substrate mounting table, wherein a distance D1 between a gas supply port provided in the adsorption inhibiting gas supplier and the substrate in (b) is greater than a distance D2 between a gas supply port provided in the source gas supplier and the substrate in (b).

According to some embodiments in the present disclosure, it is possible to form the film so as to fill the recess of the substrate.

What is claimed is:

1. A substrate processing apparatus comprising:

a substrate mounting table on which a substrate with a recess formed on the surface thereof is placed;

an adsorption inhibiting gas supplier configured to supply an adsorption inhibiting gas onto the surface of the substrate from above the substrate mounting table;

a source gas supplier configured to supply a source gas onto the surface of the substrate from above the substrate mounting table;

an elevator configured to elevate or lower the adsorption inhibiting gas supplier without elevating or lowering the source gas supplier to change a distance $D1$ between a gas supply port provided in the adsorption inhibiting gas supplier and the substrate, in a state where the distance $D1$ is greater than a distance $D2$ between a gas supply port provided in the source gas supplier and the substrate; and a controller configured to control the adsorption inhibiting gas supplier and the source gas supplier to: perform a cycle a predetermined number of times wherein the cycle comprises (a) supplying the adsorption inhibiting gas to the substrate and (b) supplying the source gas to the substrate; and stop a supply of the adsorption inhibiting gas but continue a supply of the source gas when the recess is filled to meet a predetermined condition.

2. The substrate processing apparatus of claim 1, further comprising first inert gas suppliers provided on both sides of the adsorption inhibiting gas supplier and configured to supply an inert gas onto the surface of the substrate from above the substrate mounting table, wherein a distance $P1$ between a gas supply port provided in the first inert gas suppliers and the substrate is smaller than the distance $D1$.

3. The substrate processing apparatus of claim 1, further comprising second inert gas suppliers provided on both sides of the source gas supplier and configured to supply an inert gas onto the surface of the substrate from above the substrate mounting table, wherein a distance $P2$ between a gas supply port provided in the second inert gas suppliers and the substrate is smaller than the distance $D2$.

4. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate and (b) supplying the source gas to the substrate is performed a predetermined number of times; and control the elevator to change the distance $D1$ while the film-forming process is being performed.

5. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate and (b) supplying the source gas to the substrate is performed a predetermined number of times; and control the elevator to increase the distance $D1$ while the film-forming process is being performed.

6. The substrate processing apparatus of claim 1, wherein the controller is further configured to control the elevator to adjust the distance $D1$ in accordance with a depth of the recess formed on the surface of the substrate or a width of an opening of the recess.

7. The substrate processing apparatus of claim 1, wherein the controller is further configured to control the adsorption inhibiting gas supplier to supply an inert gas through the adsorption inhibiting gas supplier when the supply of the adsorption inhibiting gas is stopped but the supply of the source gas is continued.

8. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate and (b) supplying the source gas to the substrate is performed a predetermined number of times; and control the elevator such that, during a period of performing the film-forming process, the distance $D1$ is smaller at an initial stage of the cycle than at a final stage of the cycle.

9. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate and (b) supplying the source gas to the substrate is performed a predetermined number of times; and control the elevator to set the distance $D1$ such that a pressure at which the adsorption inhibiting gas is supplied is greater at an initial stage of the cycle than at a final stage of the cycle.

10. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate and (b) supplying the source gas to the substrate is performed a predetermined number of times; and control the elevator to set the distance $D1$ such that the adsorption inhibiting gas supplied at an initial stage of the cycle reaches closer to a bottom of the recess than the adsorption inhibiting gas supplied at a final stage of the cycle.

11. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate with a and (b) supplying the source gas to the substrate is performed a predetermined number of times; and control the elevator to set the distance $D1$ such that, during a period of performing the film-forming process, the adsorption inhibiting gas is not adsorbed on a bottom of the recess.

12. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate and (b) supplying the source gas to the substrate is performed a predetermined number of times; and control the elevator to set the distance $D1$ such that, during a period of performing the film-forming process, the adsorption inhibiting gas supplied at a final stage of the cycle reaches a location of the recess more shallow than a location of the recess reached by the adsorption inhibiting gas supplied at an initial stage of the cycle.

13. The substrate processing apparatus of claim 1, wherein the controller is further configured to: control the adsorption inhibiting gas supplier and the source gas supplier to perform a film-forming process in which a cycle comprising (a) supplying the adsorption inhibiting gas to the substrate and (b) supplying the source gas to the substrate is performed a predetermined number of times; and control the elevator to set the distance D1 such that, during a period of performing the film-forming process, the distance D1 gradually increases from an initial stage to a final stage of the cycle.

14. The substrate processing apparatus of claim 1, further comprising a cartridge head comprising the adsorption inhibiting gas supplier; and an adsorption inhibiting gas exhauster configured to exhaust the adsorption inhibiting gas, wherein the elevator is further configured to change the distance D1 by elevating or lowering the adsorption inhibiting gas supplier while the adsorption inhibiting gas exhauster is not being elevated or lowered by the elevator.

15. The substrate processing apparatus of claim 1, further comprising a cartridge head comprising the adsorption inhibiting gas supplier; and an inert gas supplier provided on both sides of the adsorption inhibiting gas supplier and configured to supply an inert gas onto the surface of the substrate from above the substrate mounting table, wherein the elevator is further configured to change the distance D1 by elevating or lowering the adsorption inhibiting gas supplier while the inert gas supplier is not being elevated or lowered by the elevator.

16. A substrate processing method, comprising:

(a) placing a substrate with a recess formed on the surface thereof on a substrate mounting table;

(b) supplying an adsorption inhibiting gas onto the surface of the substrate from above the substrate mounting table;

(c) supplying a source gas onto the surface of the substrate from above the substrate mounting table;

(d) changing a distance D1 between a gas supply port provided in an adsorption inhibiting gas supplier and the substrate in a state where the distance D1 is greater than a distance D2 between a gas supply port provided in a source gas supplier and the substrate, by elevating or lowering the adsorption inhibiting gas supplier while the source gas supplier is not being elevated or lowered; and (e) performing a cycle a predetermined number of times wherein the cycle comprises supplying the adsorption inhibiting gas to the substrate and supplying the source gas to the substrate, and stopping a supply of the adsorption inhibiting gas but continuing a supply of the source gas when the recess is filled to meet a predetermined condition.

17. A method of manufacturing a semiconductor device, comprising the method of claim 16.

18. A non-transitory computer-readable recording medium storing a program that causes, by a computer, a substrate processing apparatus to perform:

(a) placing a substrate with a recess formed on the surface thereof on a substrate mounting table;

(b) supplying an adsorption inhibiting gas onto the surface of the substrate from above the substrate mounting table;

(c) supplying a source gas onto the surface of the substrate from above the substrate mounting table;

(d) changing a distance D1 between a gas supply port provided in an adsorption inhibiting gas supplier and the substrate in a state where the distance D1 is greater than a distance D2 between a gas supply port provided in a source gas supplier and the substrate, by elevating or lowering the adsorption inhibiting gas supplier while the source gas supplier is not elevated or lowered; and (e) performing a cycle a predetermined number of times wherein the cycle comprises supplying the adsorption inhibiting gas to the substrate and supplying the source gas to the substrate, and stopping a supply of the adsorption inhibiting gas but continuing a supply of the source gas when the recess is filled to meet a predetermined condition.

* * * * *